United States Patent
Fukasawa et al.

(10) Patent No.: US 8,962,355 B2
(45) Date of Patent: Feb. 24, 2015

(54) OPTICAL ELEMENT PACKAGE AND METHOD OF MANUFACTURING THE SAME

(75) Inventors: Hiroyuki Fukasawa, Tokyo (JP); Tsutomu Tanaka, Miyagi (JP)

(73) Assignee: Sony Corporation, Tokyo (JP)

(*) Notice: Subject to any disclaimer, the term of this patent is extended or adjusted under 35 U.S.C. 154(b) by 349 days.

(21) Appl. No.: 13/426,244

(22) Filed: Mar. 21, 2012

(65) Prior Publication Data

US 2012/0175793 A1    Jul. 12, 2012

Related U.S. Application Data

(62) Division of application No. 12/693,188, filed on Jan. 25, 2010, now Pat. No. 8,158,997.

(30) Foreign Application Priority Data

Jan. 30, 2009 (JP) ................. P2009-019320

(51) Int. Cl.
H01L 21/00 (2006.01)
H01L 33/54 (2010.01)
H01L 23/00 (2006.01)
H01L 31/0232 (2014.01)

(52) U.S. Cl.
CPC ............... *H01L 33/54* (2013.01); *H01L 24/97* (2013.01); *H01L 31/0232* (2013.01); *H01L 2224/48091* (2013.01); *H01L 2224/48247* (2013.01); *H01L 2224/48465* (2013.01); *H01L 2224/97* (2013.01); *H01L 2924/01013* (2013.01); *H01L 2924/01033* (2013.01); *H01L 2924/01038* (2013.01); *H01L 2924/01082* (2013.01); *H01L 2933/0091* (2013.01); *H01L 2924/01005* (2013.01); *H01L 2924/01006* (2013.01); *H01L 2924/12041* (2013.01)
USPC ............... 438/22; 438/27; 438/106; 438/112; 438/127

(58) Field of Classification Search
USPC ............................... 438/22, 27, 106, 112, 127
See application file for complete search history.

(56) References Cited

U.S. PATENT DOCUMENTS

| | | | |
|---|---|---|---|
| 2006/0027828 A1* | 2/2006 | Kikuchi | ............... 257/99 |
| 2006/0105485 A1 | 5/2006 | Basin et al. | |
| 2007/0241362 A1 | 10/2007 | Han et al. | |
| 2007/0257610 A1 | 11/2007 | Shen | |

FOREIGN PATENT DOCUMENTS

| | | |
|---|---|---|
| JP | 48-82784 | 11/1973 |
| JP | 55-27461 | 2/1980 |
| JP | 4-28460 | 3/1992 |
| JP | 09-036436 | 2/1997 |

(Continued)

OTHER PUBLICATIONS

Japanese Office Action issued Dec. 4, 2012 in corresponding Japanese Patent Application No. 2009-019320.

*Primary Examiner* — Long Pham
(74) *Attorney, Agent, or Firm* — K&L Gates LLP

(57) ABSTRACT

An optical element package includes: an optical element in a form of a chip, and a lens resin having a convex lens surface covering an optical functional surface of the optical element. The convex lens surface is formed as a rough surface having a plurality of minute convex curved surfaces having a vertex in a direction perpendicular to a plane in contact with each part of the convex lens surface.

9 Claims, 9 Drawing Sheets

(56) References Cited

FOREIGN PATENT DOCUMENTS

| JP | 2002-298397 | 10/2002 |
|---|---|---|
| JP | 2003-209289 | 7/2003 |
| JP | 2005-250446 | 9/2005 |
| JP | 2006-148147 | 8/2006 |
| JP | 2007-288198 | 1/2007 |

* cited by examiner

A-A'

B-B'

A-A'

B-B'

OPTICAL ELEMENT PACKAGE AND METHOD OF MANUFACTURING THE SAME

CROSS REFERENCES TO RELATED APPLICATIONS

The present application is a divisional application of U.S. application Ser. No. 12/693,188 filed Jan. 25, 2010, which claims priority to Japanese Patent Application JP 2009-019320 filed in the Japan Patent Office on Jan. 30, 2009, the entire content of which is hereby incorporated by reference.

BACKGROUND

The present disclosure relates to an optical element package and a method of manufacturing the same, and particularly to an optical element package having a lens resin covering an optical element such as a light emitting element, a light receiving element or the like and a method of manufacturing the same.

In an optical element package formed by packaging an optical element such as a light emitting element, a light receiving element or the like in the form of a chip, for example, the optical element is mounted on one of a pair of lead frames, and the other lead frame and the optical element are connected to each other by a wire. The pair of lead frames is supported and fixed by a frame-shaped package resin having an opening at a part mounted with the optical element and a wire-connected part in the lead frames. In addition, a lens resin is provided on an upper part of the opening of the frame-shaped package resin in a state of embedding and sealing the part mounted with the optical element and the wire-connected part. The lens resin may have a surface roughened to scatter and radiate light.

When the lens resin is formed in the optical element package having the constitution as described above, resin molding is performed using a female mold of a desired lens shape, or a matrix such as a so-called metallic mold, a resin mold or the like. When a lens resin having a roughened surface is formed, in particular, a matrix whose surface is roughened by blowing hard powder such for example as alumina powder at high pressure is used. In addition, a method is carried out which roughens the surface of a male mold for forming a matrix by blowing hard powder to the male mold and which forms the matrix from the male mold (see Japanese Patent Publication No. Sho 55-27461).

However, the rough surface obtained by blowing the hard powder at high pressure is deep in a direction of the blowing of the hard powder. Thus, a lens resin obtained by the matrix having this rough surface cannot uniformly distribute angles of divergence of light in all directions, and the light distribution characteristic of the light emitted via the lens resin forms a winding curve.

It is accordingly desirable to provide an optical element package having a lens resin with a convex lens surface formed by a rough surface providing an excellent light distribution characteristic, and to provide a method of manufacturing such an optical element package.

SUMMARY

An optical element package according to an embodiment includes: an optical element in a form of a chip; and a lens resin having a convex lens surface covering an optical functional surface of the optical element. In the optical element package, the convex lens surface of the lens resin is formed as a rough surface having a plurality of minute convex curved surfaces having a vertex in a direction perpendicular to a plane in contact with each part of the convex lens surface.

According to another embodiment, there is provided a method of manufacturing an optical element package having such a constitution, which method forms a lens resin by resin molding using a matrix having a concave lens molding surface. This lens molding surface is formed as a rough surface having a plurality of minute concave curved surfaces that are concave in a direction perpendicular to a plane in contact with each part of the lens molding surface. Such a lens molding surface is formed by discharge processing using a discharge electrode having a discharge curved surface molded into a convex lens shape.

According to the optical element package having such a constitution, the minute convex curved surfaces forming the rough surface of the convex lens surface are convex curved surfaces projecting in each direction perpendicular to each part of the convex lens surface. Thereby, for example an aggregate of light emitted from the optical element covered with the lens and scattered in each convex curved surface forms a curve infinitely close to the light distribution characteristic of the light emitted from the optical element. That is, a smoothed even light distribution characteristic without irregularities can be obtained.

As described above, according to the embodiments, a light distribution characteristic can be improved in an optical element package having a lens resin with a roughened convex lens surface. In addition, the embodiments can provide an optical element package having a lens resin with a roughened convex lens surface providing an excellent light distribution characteristic.

Additional features and advantages are described herein, and will be apparent from the following Detailed Description and the figures.

DETAILED DESCRIPTION

Embodiments will hereinafter be described in the following order.
1. Constitution of Optical Element Package
2. Method of Manufacturing Optical Element Package
3. Method of Forming Matrix for Molding Lens <1. Constitution of Optical Element Package>

Figure 1:
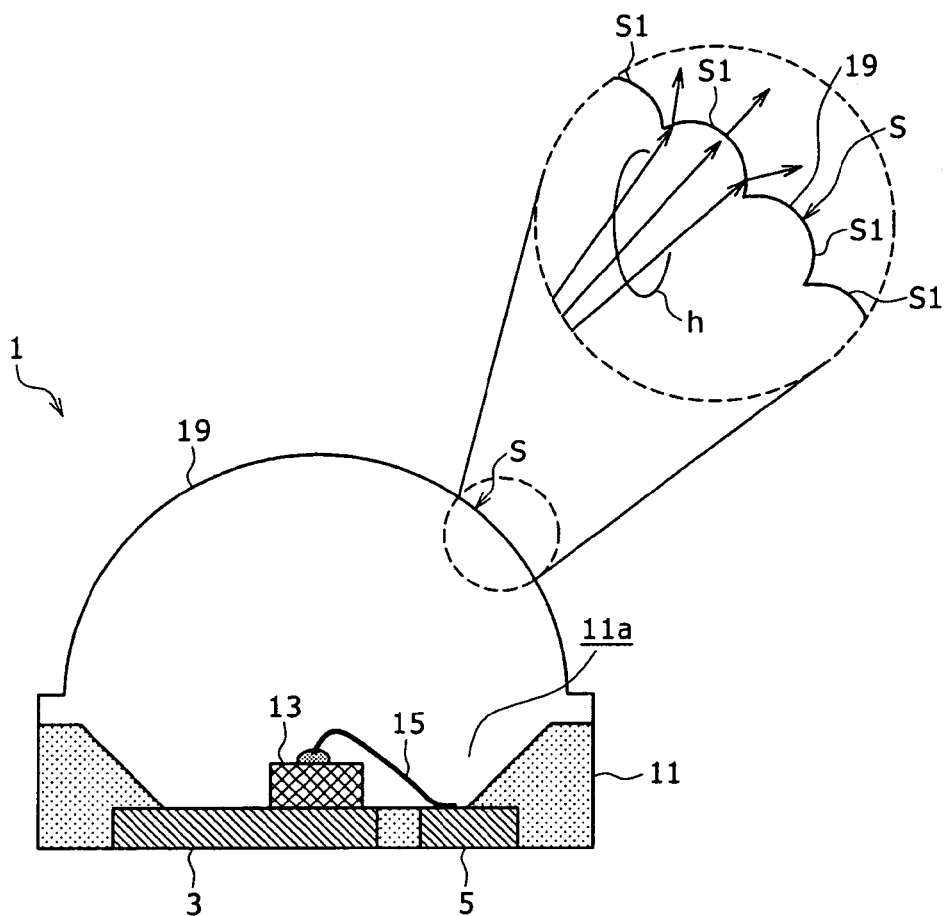
FIG. 1 is a diagram showing a constitution of an optical element package according to an embodiment.

FIG. 1 is a schematic sectional view of an optical element package 1 according to an embodiment. The optical element package 1 shown in FIG. 1 is a package for mounting a chip-shaped light emitting element on a mounting substrate. The optical element package 1 is formed as follows.

The light emitting element package 1 includes two lead electrodes 3 and 5, a package resin 11 for fixing and supporting the lead electrodes 3 and 5, an optical element 13 mounted on the lead electrode 3, a wire 15 for connecting the optical element 13 and the lead electrode 5 to each other, and a lens resin 19 for covering the optical element 13. The embodiment is characterized particularly by the constitution of a convex lens surface S in the lens resin 19. Each of these members in the constitution of the light emitting element package 1 will hereinafter be described in detail.

The two lead electrodes 3 and 5 are arranged in parallel with each other with each of the lead electrodes 3 and 5 insulated. The lead electrode 3 as one of the lead electrodes is formed such that a part of the lead electrode 3 has a wide width as a die pad for mounting the element.

The package resin 11 is formed integrally with the lead electrodes 3 and 5. The package resin 11 has a concave part 11a for exposing a part of each of the lead electrodes 3 and 5 as a central part of the package resin 11. The concave part 11a is formed into a side wall taper shape with the diameter of a circular opening decreased from an upper part of the opening to a bottom part exposing the lead electrodes 3 and 5.

Suppose that the optical element 13 is a chip-shaped light emitting element such for example as a light emitting diode (LED) or a chip-shaped light receiving element, and that the optical element 13 has an optical functional surface such as a light emitting surface, a light receiving surface or the like and an electrode on a surface on an opposite side from the optical functional surface. Such an optical element 13 is die-bonded onto the lead electrode 3 with the optical functional surface facing upward within the concave part 11a of the package resin 11.

The wire 15 is provided in a state of connecting the optical element 13 and the other lead electrode 5 to each other within the concave part 11a of the package resin 11.

The lens resin 19 forms a convex lens. The lens resin 19 is provided on the concave part 11a of the package resin 11 in a state of embedding the optical element 13 and the wire 15. In addition, the convex lens surface S of the lens resin 19 is roughened into a satin finished surface having minute convex curved surfaces S1, S1, . . . , as shown in an enlarged view of principal parts.

In particular, a first feature of the lens resin 19 according to the present embodiment is that each of the minute convex curved surfaces S1, S1, . . . is convex in a direction perpendicular to each surface part of the convex lens surface S. That is, each minute convex curved surface S1 is provided in the convex lens surface S forming one lens resin 19 such that the part of a vertex in a direction perpendicular to a plane in contact with each part of the convex lens surface S projects most.

A second feature is that each minute convex curved surface S1 is symmetric with a direction perpendicular to a plane in contact with each part of the convex lens surface S as an axis.

A third feature is that the minute convex curved surfaces S1, S1, . . . are each different in size and height, have irregular sizes and heights, and are arranged irregularly.

A fourth feature is that each minute convex curved surface S1 has a height sufficiently smaller than the diameter of a bottom surface thereof.

Figure 2:
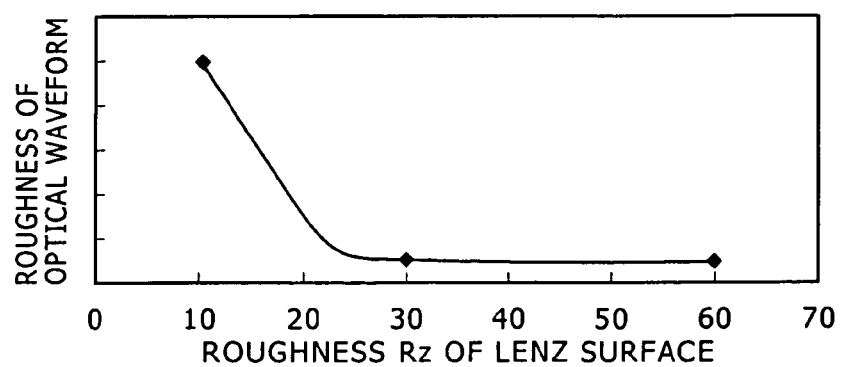
FIG. 2 is a schematic diagram showing relation between the roughness of a lens surface and the roughness of an optical waveform of light passing through the lens surface.

FIG. 2 is a schematic diagram showing the roughness of an optical waveform of light passing through the lens surface with respect to the roughness Rz of the lens surface. Incidentally, suppose that the roughness of the optical waveform is for example a difference between a minimum value and a maximum value of luminance with respect to an angle of radiation.

As shown in FIG. 2, the roughness of the optical waveform of light passing through the roughened convex lens surface is inversely proportional to the roughness Rz of the lens surface in a range up to a certain magnitude of the roughness Rz of the lens surface. Thus, the height of the minute convex curved surfaces S1 in the lens resin 19 is desirably set so as to provide the roughness Rz of the lens surface which roughness Rz can effectively reduce the roughness of the optical waveform of the light.

Figure 3:
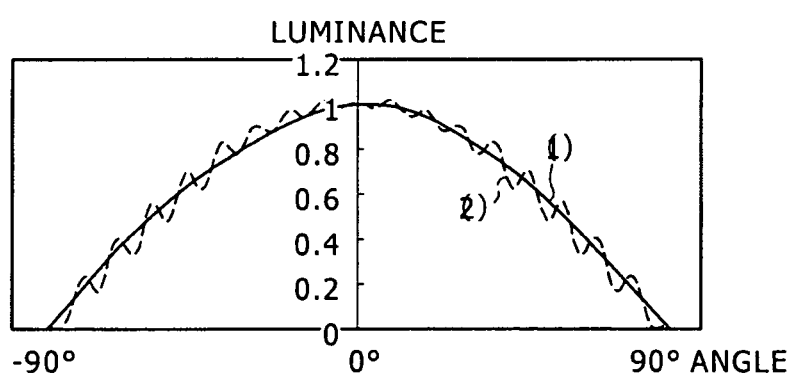
FIG. 3 is a graph of assistance in explaining effects of the embodiment, the graph showing relation between an angle of radiation and luminance.

In the optical element package 1 formed as described above, the minute convex curved surfaces S1 forming the roughened convex lens surface S are convex curved surfaces projecting in respective directions perpendicular to the respective parts of the convex lens surface S. Thereby, for example an aggregate of light h emitted from the optical element 13 covered with the lens resin 19 and scattered in each convex curved surface S1 forms a curve infinitely close to the light distribution characteristic of the light emitted from the optical element 13, as represented by a curve of (1) in FIG. 3.

In addition, each minute convex curved surface S1 is symmetric with a direction perpendicular to a plane in contact with each part of the convex lens surface S as an axis. Therefore, for example the light h emitted from the optical element 13 covered with the lens resin 19 and scattered in each minute convex curved surface S1 is scattered uniformly in each minute convex curved surface S1 and radiated uniformly to the outside of the lens resin 19.

As a result of the above, a smoothed even light distribution characteristic without irregularities can be obtained.

Incidentally, experiments have confirmed that when the roughness Rz of the convex lens surface S is Rz=about 20 to 40 µm, an effect of smoothing the light emitted from the optical element 13 is enhanced and a smooth light distribution is exhibited.

Further, because the minute convex curved surfaces S1, S1, . . . are each different in size and height, and are arranged irregularly, the chromatic aberration of the light passing through the lens resin 19 can be suppressed.

In addition, each minute convex curved surface S1 has a height sufficiently smaller than for example the diameter of the bottom surface thereof. Thus, the minute convex curved surfaces S1 do not exceed a critical angle (an angle of incidence at which almost all light is reflected to the inside) with respect to the angle of the light h emitted from the optical element 13, and reflected light (return light) from the minute convex curved surfaces S1 can be reduced infinitely.

On the other hand, a conventional convex lens surface formed by using a matrix whose surface is roughened by blowing hard powder at high pressure is formed of minute convex curved surfaces projecting in a state of being aligned in a direction of the blowing of the hard power. Thus, an aggregate of light scattered at each convex curved surface of such a convex lens surface forms a winding curve as represented by a broken line of (2) in FIG. 3.

<2. Method of Manufacturing Optical Element Package>

FIGS. 4A to 7C are manufacturing process diagrams of a method of manufacturing an optical element package according to an embodiment. An embodiment of a method of manufacturing an optical element package will be described in the following with reference to these drawings.

Figure 4A:
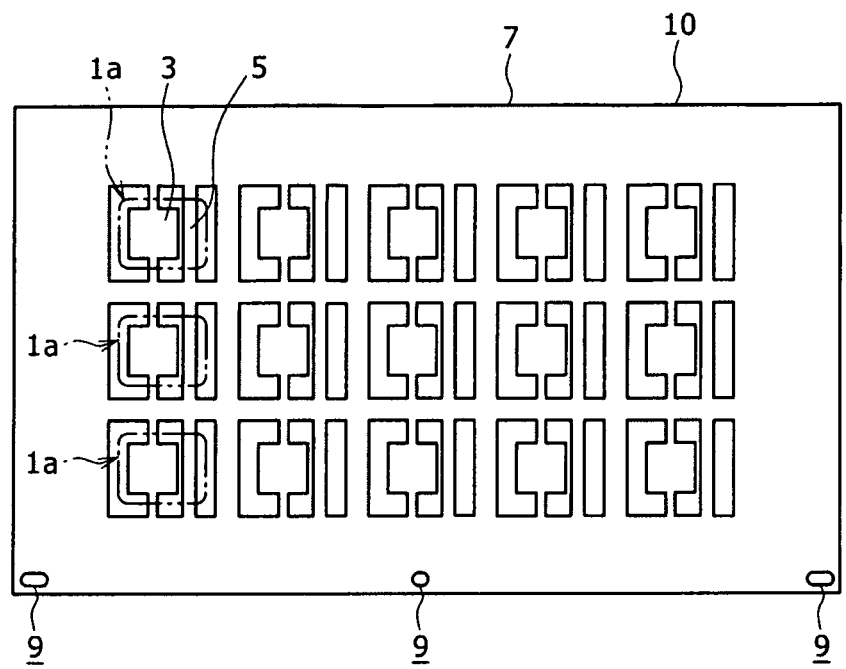
FIGS. 4A and 4B are process diagrams (1) of a method of manufacturing the optical element package according to the embodiment.

First, as shown in FIG. 4A, a lead frame 10 for forming a plurality of optical element packages is prepared. A plurality of package parts 1a are set vertically and horizontally in the lead frame 10. Two lead electrodes 3 and 5 as described above are disposed in parallel with each other in each of the package parts 1a. The two lead electrodes 3 and 5 are connected to each other by an outer lead 7 in the form of a frame, and are thus formed integrally with each other.

The lead frame 10 is also provided with alignment holes 9 for a metallic mold for lens resin molding to be performed later. Guide pins for alignment which guide pins are provided to the metallic mold are inserted into the alignment holes 9.

Figure 4B:
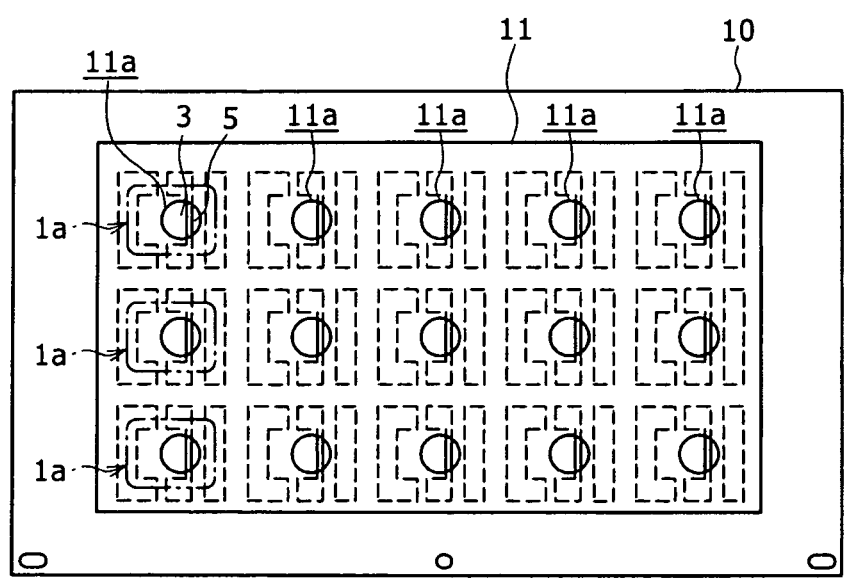

Next, as shown in FIG. 4B, each of the inner leads 3 and 5 in the lead frame 10 is fixed by a package resin 11. This package resin 11 has an external shape in the form of a plate, and is formed integrally with the lead frame 10. The package resin 11 has a plurality of concave parts 11a as described above which concave parts 11a are formed in a state of exposing a part of the inner leads 3 and 5 in each package part 1a. The package resin 11 formed as described above may be molded by using a metallic mold, for example.

Figure 5A:
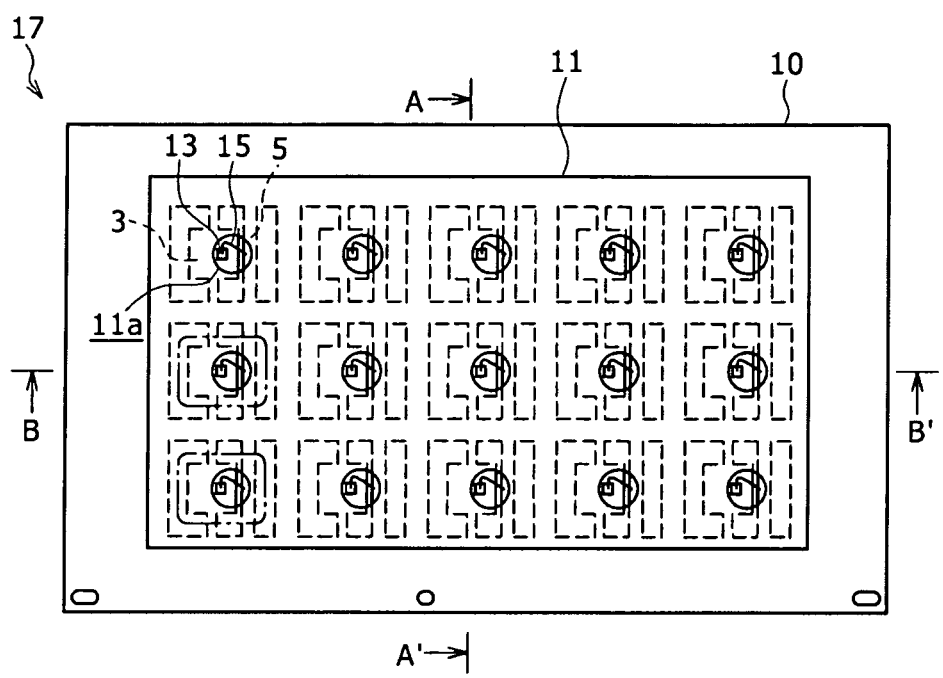
FIG. 5A is a process diagram (2) of the method of manufacturing the optical element package according to the embodiment.
Figure 5B:
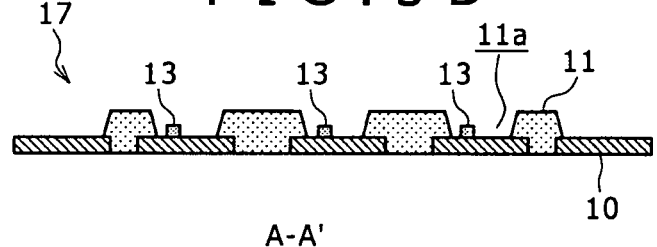
FIGS. 5B and 5C are sectional views of various parts in FIG. 5A.
Figure 5C:
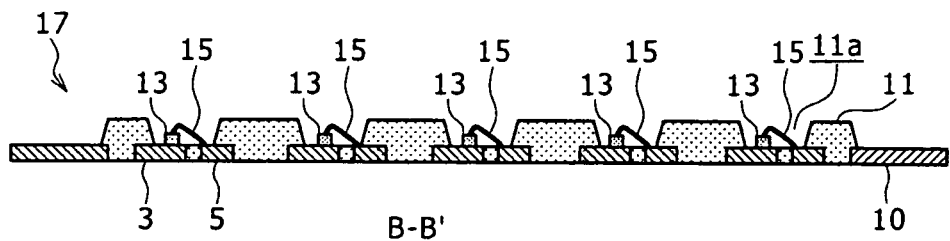

Next, as shown in a plan view of FIG. 5A, a sectional view of FIG. 5B taken along a line A-A' of FIG. 5A, and a sectional view of FIG. 5C taken along a line B-B' of FIG. 5A, an optical element 13 such for example as an LED chip is die-bonded onto the lead electrode 3 for a die pad exposed to each concave part 11a in the package resin 11. Thereafter, the optical element 13 and the other lead electrode 5 in the lead frame 10 are connected to each other by a wire 15.

As a result of the above, a plate-shaped structure 17 is formed which has optical elements 13 mounted within the plurality of concave parts 11a provided in the package resin 11.

Figure 6A:
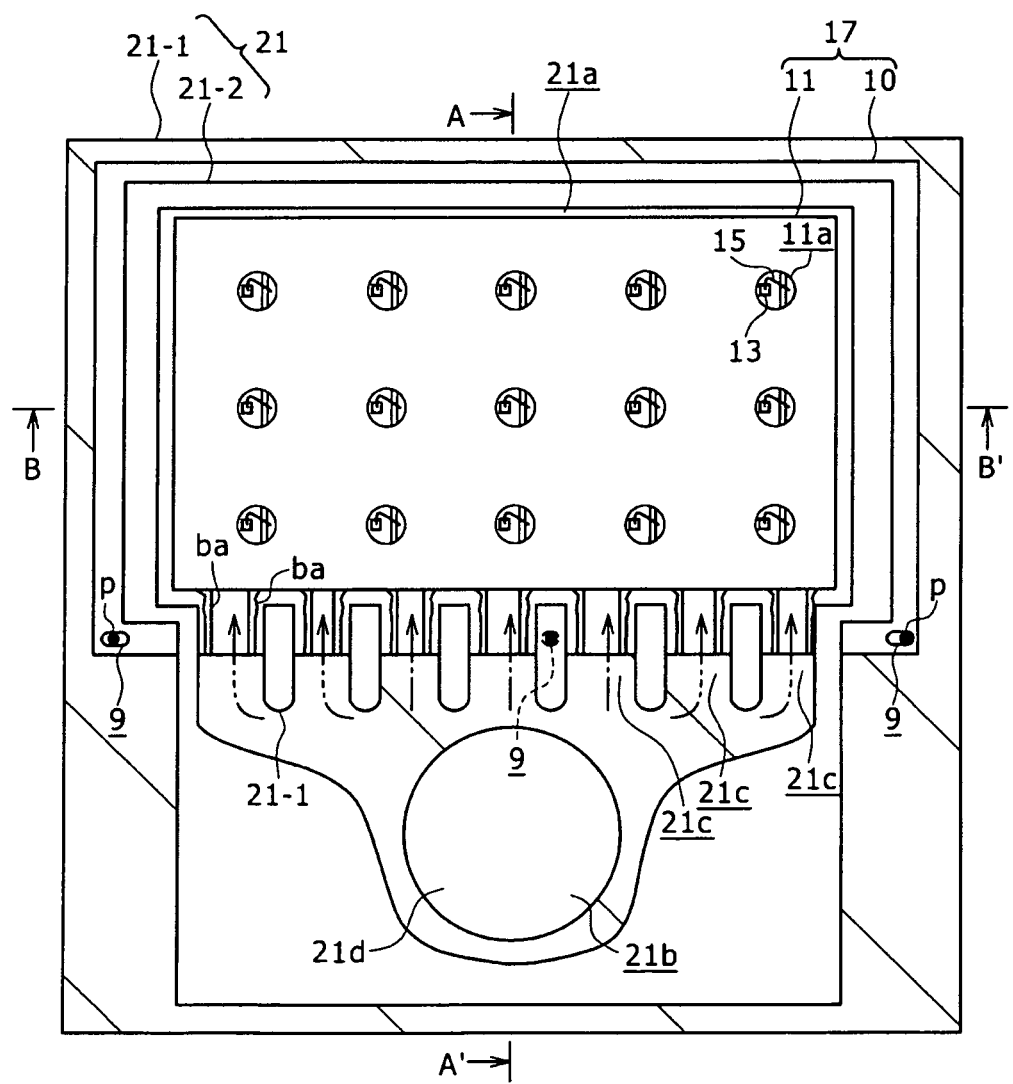
FIG. 6A is a process diagram (3) of the method of manufacturing the optical element package according to the embodiment.
Figure 6B:
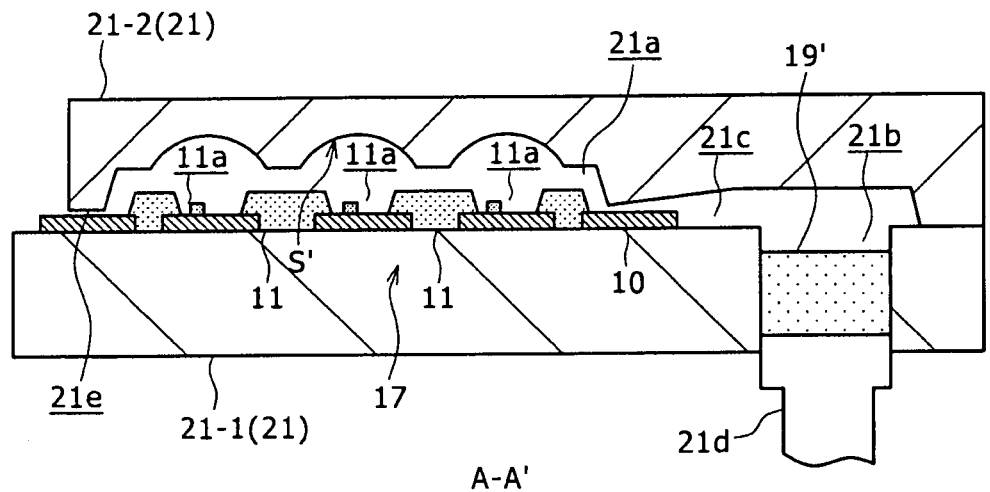
FIGS. 6B and 6C are sectional views of various parts in FIG. 6A.
Figure 6C:
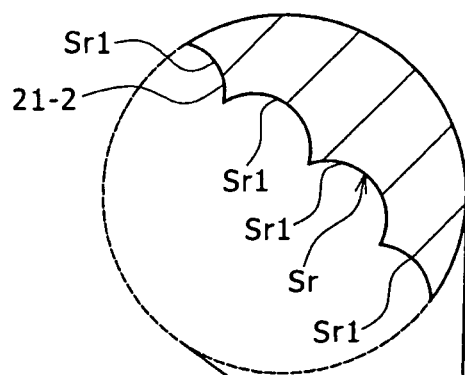
Figure 6C:
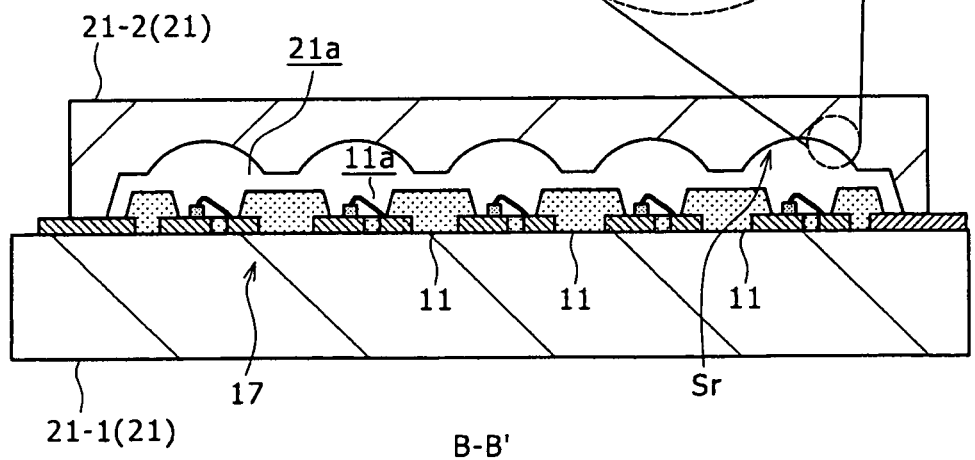

A next process is represented in FIGS. 6A to 6C. FIG. 6A is a plan view. FIG. 6B is a sectional view taken along a line A-A' of FIG. 6A and FIG. 6C is a sectional view taken along a line B-B' of FIG. 6A. As shown in these figures, the structure 17 having the above-described constitution is fixed to a metallic mold 21 for lens resin molding.

The metallic mold 21 in this case is formed by a lower mold 21-1 and an upper mold 21-2. The lower mold 21-1 has three guide pins p for alignment which guide pins correspond to the alignment holes 9 provided in the lead frame 10. Then, the lead frame 10 is aligned with the metallic mold 21 by inserting the three guide pins p into the respective alignment holes 9 provided in the lead frame 10. In addition, the periphery of the aligned lead frame 10 is sandwiched between the lower mold 21-1 and the upper mold 21-2, whereby the structure 17 is fixed in a predetermined arrangement state with respect to the metallic mold 21.

In a state in which the structure 17 is aligned and fixed to the metallic mold 21 as described above, a cavity 21a for housing a package resin 11 is formed between the lower mold 21-1 and the upper mold 21-2.

A plurality of concave lens molding surfaces Sr are arranged and formed in the top surface of the cavity 21a in the upper mold 21-2. The concave lens molding surfaces Sr are arranged so as to correspond to the respective concave parts 11a of the structure 17 in a state in which the structure 17 is housed inside. The upper mold 21-2 having such concave lens molding surfaces Sr is formed as a matrix (female mold) for molding the lens resin (19) described with reference to FIG. 1. Thus, the concave lens molding surfaces Sr of the upper mold 21-2 are roughened into a satin finished surface having minute concave curved surfaces Sr1, Sr1, . . . , as shown in an enlarged view of principal parts.

In particular, also in the upper mold 21-2, a first feature of the lens molding surfaces Sr is that each of the minute concave curved surfaces Sr1, Sr1, . . . is formed by a curved surface that is concave in a direction perpendicular to each surface part of the lens molding surfaces Sr. That is, each minute concave curved surface Sr1 is provided in the concave lens molding surfaces Sr so as to be deepest in a direction perpendicular to a plane in contact with each part of the lens molding surfaces Sr.

A second feature is that each minute concave curved surface Sr1 is symmetric with a direction perpendicular to a plane in contact with each part of the lens molding surfaces Sr as an axis.

A third feature is that the minute concave curved surfaces Sr1, Sr1, . . . are each different in size and height, have irregular sizes and heights, and are arranged irregularly.

A fourth feature is that each minute concave curved surface Sr1 has a depth sufficiently smaller than for example the diameter of a bottom surface thereof.

Incidentally, a method of producing such an upper mold 21-2 will be described later.

In addition, a pot 21b supplied with a resin 19' to be filled and injected into the cavity 21a and a plurality of supply paths (so-called runners) 21c for connecting the pot 21b and the cavity 21a with each other are formed as a space part other than the cavity 21a in the metallic mold 21. Further, an air vent 21e for connecting the cavity 21a and the outside of the metallic mold 21 to each other is provided between the lower mold 21-1 and the upper mold 21-2 on a side opposite from the supply paths 21c in a state in which the lower mold 21-1 and the upper mold 21-2 are superimposed on each other. Incidentally, while only one supply path 21c may be provided, the bending of the supply path 21c can be prevented while resin supply is secured by providing the supply path 21c in a state of a plurality of divided paths.

The pot 21b is a space part formed in the shape of a syringe within which a plunger 21d is provided. The resin 19' within the pot 21b is supplied into the cavity 21a through the supply paths 21c by pushing pressure of the plunger 21d provided within the pot 21b.

A plurality of supply paths 21c are provided at equal intervals, for example, in one of four wall surfaces forming the cavity 21a, and form a plurality of passages for providing communication between the pot 21b and the cavity 21a.

When the lead frame 10 is fixed to the metallic mold 21 as described above, the lower mold 21-1 and the upper mold 21-2 are heated to about 150 to 200° C. in advance. In addition, an uncured resin 19' is dropped into the pot 21b.

As described above, with the structure 17 aligned and fixed, the uncured resin 19' within the pot 21b is injected and filled into the cavity 21a via the plurality of runners 21c by the pushing-up movement of the plunger 21d within the pot 21b. Thereby, the uncured resin 19' is filled and injected into the entire region of the cavity 21a housing the structure 17, as described above. At this time, an air within the cavity 21a is drawn out from the air vent 21e provided on the side opposite from the runners 21c to the outside of the metallic mold 21.

Thereafter pressurization is continued for a few minutes while the height of the plunger 21d is maintained in a state in which the uncured resin 19' is filled and injected in the entire region of the cavity 21a.

Figure 7A:
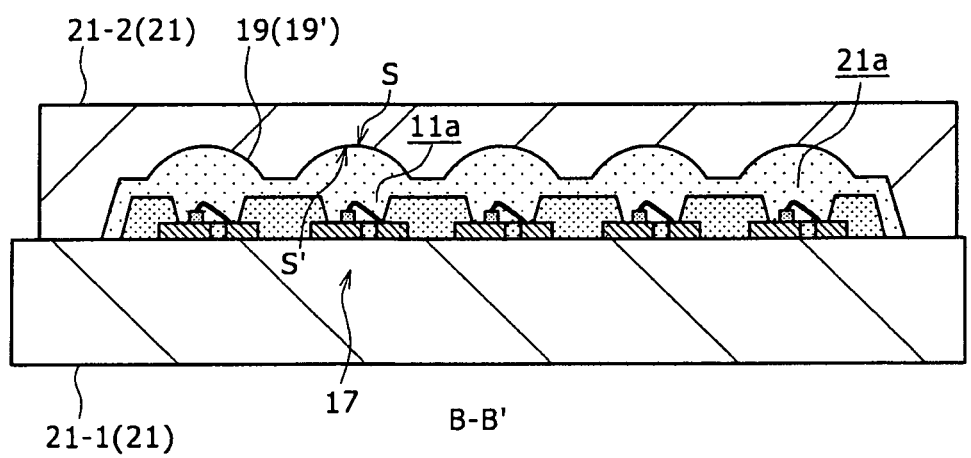
FIGS. 7A to 7C are process diagrams (4) of the method of manufacturing the optical element package according to the embodiment.

Thereby, as shown in FIG. 7A, the uncured resin (19') filled and injected in the entire region of the cavity 21a is cured by heating from the metallic mold 21. Then, the concave parts 11a of the structure 17 are filled, and a lens resin 19 having a convex lens surface S that is convex outward is formed on each of the concave parts 11a.

Figure 7B:
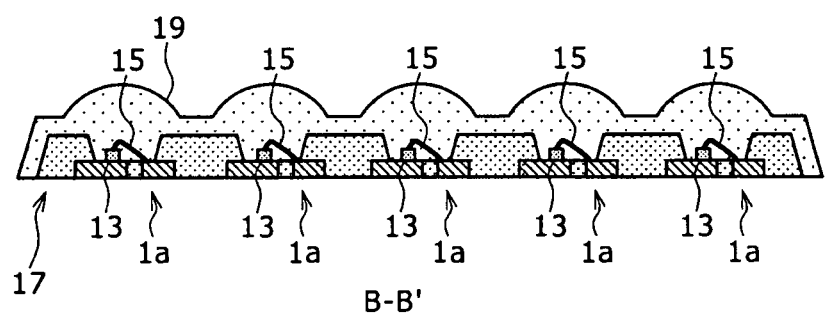

Next, as shown in FIG. 7B, the structure 17 and the lens resin 19 formed integrally with the structure 17 are removed from the metallic mold 21. Thereby, the lens resin 19 having convex shapes is provided in a state of sealing each optical element 13 and each wire 15 on the structure 17 formed by mounting the optical element 13 in each package part 1a. The lens resin 19 having the convex shapes is continuous between the package parts 1a, and is formed integrally.

Figure 7C:
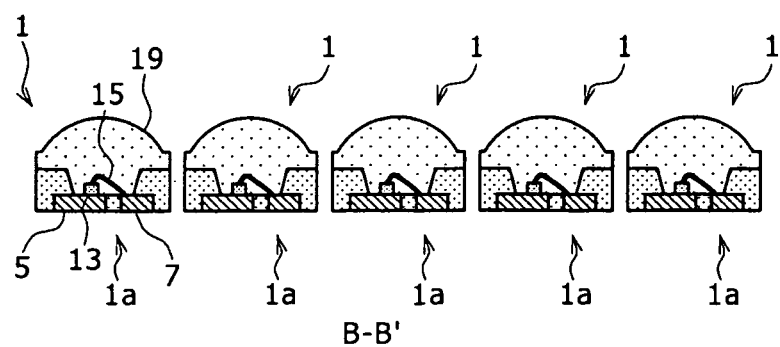

After the above process, as shown in FIG. 7C, the lens resin 19 and the structure 17 are divided into each package part 1a.

As a result of the above, a plurality of optical element packages 1 formed by sealing the optical element 13 and the wire 15 mounted on the lead electrodes 3 and 5 with the convex lens resin 19 are obtained. The lens resin 19 in the thus obtained optical element packages 1 is roughened into a satin finished surface having minute convex curved surfaces S1, S1, . . . that are convex in a direction perpendicular to each part of the convex lens surface S, as described with reference to FIG. 1.

<3. Method of Producing Matrix for Molding Lens>

Figure 8A:
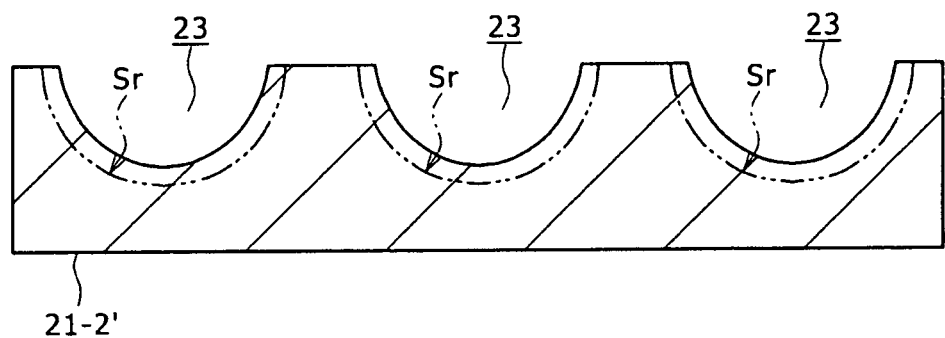
FIGS. 8A and 8B are process diagrams of assistance in explaining the manufacture of a metallic mold used to manufacture the optical element package according to the embodiment.
Figure 8B:
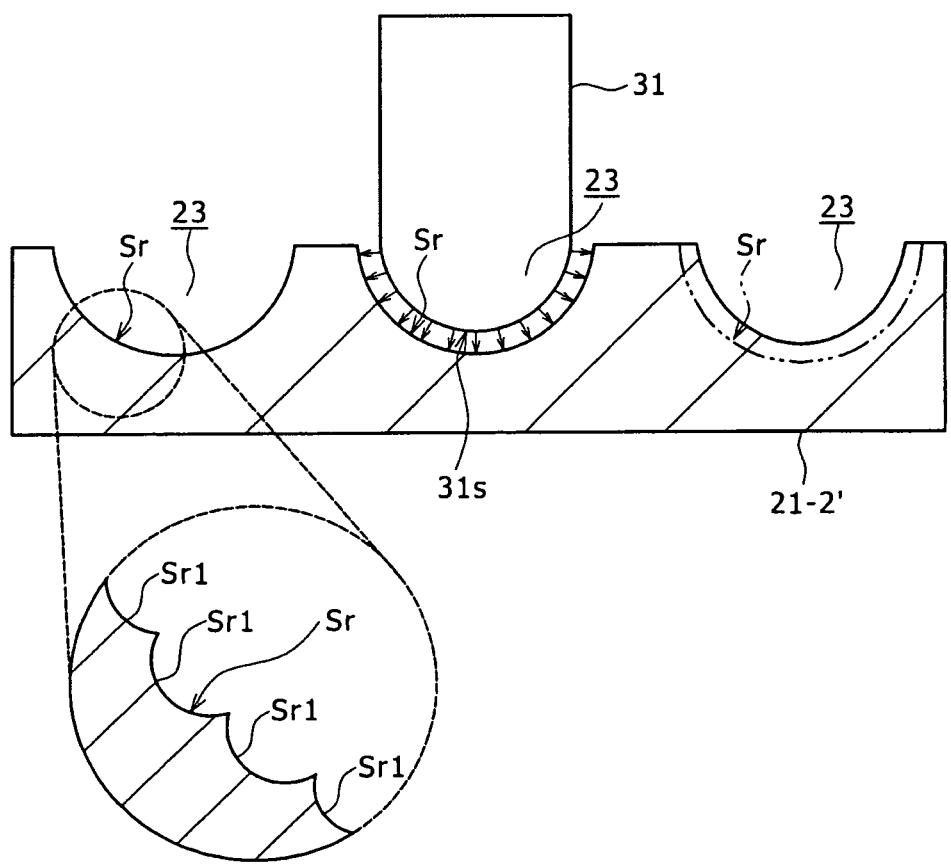

FIGS. 8A and 8B represent a method of producing a matrix used to mold the lens resin in the above manufacturing process.

First, as shown in FIG. 8A, a plate material 21-2' for forming the matrix is prepared. Suppose that the plate material 21-2' is formed of a metallic material, for example. Then, a concave part 23 is formed in a part of the plate material 21-2' which part corresponds to a position where each lens molding surface Sr is to be formed. Each concave part 23 is formed so as to be shallower than the lens molding surface Sr inside a region where the lens molding surface Sr is to be formed. The wall surface shape of each concave part 23 does not need to be similar to the lens molding surface Sr of a concave shape as a whole, but is desirably similar to the concave shape of the lens molding surface Sr. Such a concave part 23 is formed by cutting processing, for example, and does not need to be subjected to mirror surface processing.

Next, as shown in FIG. 8B, a discharge electrode 31 is prepared which has a convex discharge curved surface 31s having a curvature substantially equal to that of the concave shape of the lens molding surfaces Sr, that is, a discharge curved surface 31s that is substantially the same as the convex lens surface S of the lens resin (19) to be molded. The discharge curved surface 31s of the discharge electrode 31 does not need to have minute convex curved surfaces. Then, in an oil tank, such a discharge electrode 31 is brought gradually closer to the concave part 23 in a state of a high voltage being applied.

Thereby, a spark discharge is made to occur between the discharge curved surface 31s of the discharge electrode 31 and the inner wall of the concave part 23 in the plate material 21-2', and the wall surface of the plate material 21-2' is cut away gradually. At this time, the spark occurs at a position of shortest distance between the discharge curved surface 31s and the inner wall of the concave part 23 in the plate material 21-2'. Thus, finally, the inner wall of the concave part 23 in the plate material 21-2' is gradually processed into a concave shape retaining equal intervals to the discharge curved surface 31s of the discharge electrode 31, and further the side wall is cut away irregularly in a direction perpendicular to each part of the processed surface. Thereby a plurality of minute concave curved surfaces Sr1 are formed.

Thus, all concave parts 23 formed in the plate material 21-2' are sequentially formed as concave lens molding surfaces Sr having a plurality of minute concave curved surfaces Sr1. Thereby a metallic mold (upper mold 21-2') serving as a matrix for forming the lens resin (19) is produced. Incidentally, discharge processing may be performed on a plurality of concave parts 23 formed in the plate material 21-2' simultaneously using a plurality of discharge electrodes 31.

Such a producing method is a molding method that gradually cuts away the wall surface of the plate material 21-2' by effecting a spark discharge between the convex discharge curved surface 31s having a curvature substantially equal to that of the concave shape of the lens molding surfaces Sr and the inner wall of the concave part 23 in the plate material 21-2'. Thus, the inner wall of the concave part 23 is cut away deepest in a direction perpendicular to each part of the discharge curved surface 31s from each of irregular positions. Thereby, as concave curved surfaces substantially identical to the discharge curved surface 31s as a convex curved surface, the lens molding surfaces Sr are obtained in which each minute concave curved surface (minute concave curved surface Sr1) that is deepest in a direction perpendicular to a plane in contact with each part of the concave curved surfaces has irregular size and height and is disposed and formed irregularly.

In addition, each minute concave curved surface Sr1 formed by such discharge processing is shaped symmetrically with a direction perpendicular to a plane in contact with each part of the lens molding surface Sr as an axis. Further, due to irregularities of the discharge, each of the formed minute concave curved surfaces Sr1 is different in size and depth, and is disposed irregularly. In addition, each of the minute concave curved surfaces Sr1 is formed to a depth sufficiently smaller than for example the diameter of a bottom surface thereof.

As a result, the upper mold 21-2 of the metallic mold having the constitution described with reference to FIG. 6A to FIG. 6C, that is, the matrix enabling the formation of the lens resin providing a smoothed even light distribution characteristic without irregularities can be produced by a simple method such as discharge processing.

On the other hand, while a lens resin obtained by resin molding using a matrix resulting from mirror surface processing by lapping using a diamond paste or the like can also provide a smoothed even light distribution characteristic without irregularities, mirror surface processing takes an extensive time. Thus, to apply mirror surface processing to the formation of a matrix having a plurality of lens molding surfaces needs a cost and a time that are practically impossible.

Figure 9A:
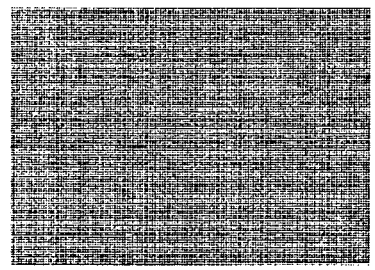
FIGS. 9A and 9B are optical microscope images of a convex lens surface of a lens resin produced in the embodiment.

FIG. 9A is an optical microscope image of a lens molding surface in the matrix obtained by such a producing method. This figure shows that the lens forming surface roughened by minute concave curved surfaces of irregular shapes is obtained by the method according to the above-described embodiment.

Figure 9B:
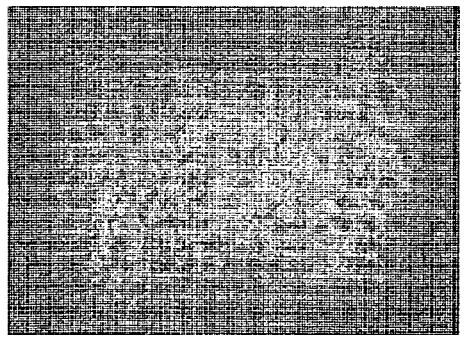

FIG. 9B is an optical microscope image of a convex lens surface in the lens resin obtained by resin molding using the matrix. This figure shows that the convex lens surface roughened by minute convex curved surfaces of irregular shapes is obtained by the method according to the above-described embodiment. Incidentally, FIG. 9A and FIG. 9B are optical microscope images of respective magnifications.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of manufacturing an optical element package, said method comprising:
   when forming a lens resin covering an optical functional surface of an optical element in a form of a chip,
   performing resin molding using a matrix having a concave lens molding surface to form an overall primary convex shape of the lens, the lens molding surface being formed as a rough surface having a plurality of minute secondary concave curved surfaces formed on the primary convex shape, the secondary concave curved surface being concave in a direction perpendicular to a plane in contact with each part of the lens molding surface.

2. The method of manufacturing the optical element package according to claim 1, wherein said plurality of minute secondary concave curved surfaces are formed symmetrically with the direction perpendicular to the plane in contact with each part of the lens molding surface as an axis.

3. The method of manufacturing the optical element package according to claim 1, wherein said plurality of minute secondary concave curved surfaces are each formed in a shape having one of a different depth and a different size.

4. The method of manufacturing the optical element package according to claim 1, wherein said plurality of minute secondary concave curved surfaces are formed to depths smaller than diameters of bottom surfaces of said plurality of minute secondary concave curved surfaces.

5. The method of manufacturing the optical element package according to claim 1, wherein said matrix is formed by discharge processing using a discharge electrode having a discharge curved surface molded into a convex lens shape.

6. The method of manufacturing the optical element package according to claim 1, wherein when said lens resin is formed, an uncured resin is filled and injected into a cavity formed by using said matrix with said optical element housed in the cavity.

7. A method of manufacturing an optical element package, said method comprising:
   when forming a lens resin covering an optical functional surface of an optical element in a form of a chip,
   performing resin molding using a matrix having a concave lens molding surface, the lens molding surface being formed as a rough surface having a plurality of minute concave curved surfaces that are concave in a direction perpendicular to a plane in contact with each part of the lens molding surface,
   wherein said plurality of minute concave curved surfaces are each formed in a shape having one of a different depth and a different size.

8. A method of manufacturing an optical element package, said method comprising:
   when forming a lens resin covering an optical functional surface of an optical element in a form of a chip,
   performing resin molding using a matrix having a concave lens molding surface, the lens molding surface being formed as a rough surface having a plurality of minute concave curved surfaces that are concave in a direction perpendicular to a plane in contact with each part of the lens molding surface,
   wherein said matrix is formed by discharge processing using a discharge electrode having a discharge curved surface molded into a convex lens shape.

9. A method of manufacturing an optical element package, said method comprising:
   when forming a lens resin covering an optical functional surface of an optical element in a form of a chip,
   performing resin molding using a matrix having a concave lens molding surface, the lens molding surface being formed as a rough surface having a plurality of minute concave curved surfaces that are concave in a direction perpendicular to a plane in contact with each part of the lens molding surface,
   wherein when said lens resin is formed, an uncured resin is filled and injected into a cavity formed by using said matrix with said optical element housed in the cavity.

* * * * *